(12) United States Patent
AuBuchon (10) Patent No.: US 11,978,625 B2
(45) Date of Patent: May 7, 2024

(54) METHODS OF FORMING METAL NITRIDE FILMS

(71) Applicant: Applied Materials, Inc., Santa Clara, CA (US)

(72) Inventor: Joseph AuBuchon, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 449 days.

(21) Appl. No.: 17/503,599

(22) Filed: Oct. 18, 2021

(65) Prior Publication Data
US 2023/0123038 A1    Apr. 20, 2023

(51) Int. Cl.
| H01L 21/00 | (2006.01) |
| H01J 37/32 | (2006.01) |
| H01L 21/02 | (2006.01) |
| H01L 21/311 | (2006.01) |

(52) U.S. Cl.
CPC .... *H01L 21/0228* (2013.01); *H01J 37/32091* (2013.01); *H01J 37/32165* (2013.01); *H01L 21/02126* (2013.01); *H01L 21/0214* (2013.01); *H01L 21/0217* (2013.01); *H01L 21/0234* (2013.01); *H01L 21/31111* (2013.01); *H01J 2237/332* (2013.01); *H01J 2237/334* (2013.01)

(58) Field of Classification Search
CPC .......... H01L 21/0228; H01L 21/02126; H01L 21/0214; H01L 21/0217; H01L 21/0234; H01L 21/31111; H01J 37/32091; H01J 37/32165
See application file for complete search history.

(56) References Cited

U.S. PATENT DOCUMENTS

| 4,401,507 | A | 8/1983 | Engle et al. |
| 9,144,147 | B2 | 9/2015 | Yang et al. |
| 10,134,581 | B2 | 11/2018 | Li et al. |
| 10,176,980 | B2 | 1/2019 | Manna et al. |
| 10,319,583 | B2 | 6/2019 | Li et al. |
| 2017/0022612 | A1 | 1/2017 | Lei et al. |
| 2019/0148398 | A1 | 5/2019 | Kim et al. |
| 2020/0321209 | A1 | 10/2020 | Ishikawa et al. |

FOREIGN PATENT DOCUMENTS

| JP | 2020017709 A | 1/2020 |
| WO | 2017160647 A1 | 9/2017 |
| WO | 2021055093 A1 | 3/2021 |

OTHER PUBLICATIONS

PCT International Search Report and Written Opinion in PCT/US2022/046638 dated Feb. 14, 2023, 11 pages.

*Primary Examiner* — Victor A Mandala
*Assistant Examiner* — Colleen E Snow
(74) *Attorney, Agent, or Firm* — Servilla Whitney LLC (57) ABSTRACT

Embodiments of the disclosure include methods of forming a film comprising conformally depositing a first film on a substrate; treating the first film with a first plasma to form a second film; treating the second film with a second plasma to form a third film; and selectively removing the first film, a portion of the second film, and the third film.

20 Claims, 3 Drawing Sheets

METHODS OF FORMING METAL NITRIDE FILMS

TECHNICAL FIELD

The present disclosure relates generally to methods of depositing films. In particular, the disclosure relates to processes for selective deposition of ALD films.

BACKGROUND

Deposition of films on a substrate is an important process in a variety of industries including semiconductor processing, diffusion barrier coatings, and dielectrics for magnetic read/write heads. In the semiconductor industry, in particular, miniaturization requires atomic level control of film deposition to produce conformal coatings on high aspect structures. One method for deposition of films with control and conformal deposition is atomic layer deposition (ALD), which employs sequential surface reactions to form layers of a same precise thickness on all parts of a structure. Most ALD processes are based on binary reaction sequences which deposit a binary compound film. Because the surface reactions are sequential, the two gas phase reactants are not in contact, and possible gas phase reactions that may form and deposit particles are limited.

Most film properties cannot meet practical requirements due to lack of continuity, lack of conformality, poor film thickness control, and poor film composition control, such as hydrogen contamination and/or different bonding states of carbon in the film. Traditionally, films formed by chemical vapor deposition (CVD) and physical vapor deposition (PVD) processes are often non-continuous and not conformal. Additionally, the CVD process generally has less thickness control than an ALD process and/or can result in the creation of gas phase particles which can cause defects in the resultant device.

Selective deposition of materials can be accomplished in a variety of ways. For instance, some processes may have inherent selectivity to surfaces based on their surface chemistry. These processes are rare, and typically specific to the reactants used, materials formed and the substrate surfaces. However, selective deposition processes face the same challenges of meeting practical requirements.

Therefore, there is a need for processes for selective deposition of ALD films.

SUMMARY

One or more embodiments of the disclosure are directed to methods of forming films. The methods comprise conformally depositing a first film having a horizontal surface and a vertical surface on a substrate. The substrate comprises at least one feature having a top surface, a bottom surface, and a sidewall. The horizontal surface of the first film is treated with a first plasma to form a second film on the horizontal surface. The second film has a lower wet etch rate than the first film after treatment with the first plasma. The second film on the horizontal surface is treated with a second plasma to form a third film on the horizontal surface. The third film had a higher wet etch rate than the second film after treatment with the second plasma. The methods further comprise selectively removing the first film, a portion of the second film, and the third film.

Additional embodiments of the disclosure are directed to processing methods comprising exposing a substrate to a deposition environment comprising at least one deposition cycle. The at least one deposition cycle comprises sequential exposure of the substrate to a silicon precursor and a nitrogen containing reactant to form a first silicon nitride film on the substrate. The substrate has at least one feature including a top surface, a bottom surface, and a sidewall. The first silicon nitride film is treated with a first directional plasma to form a second silicon nitride film. The second silicon nitride film has a lower wet etch rate than the first silicon nitride film after treatment with the first directional plasma. The second silicon nitride film is treated with a second directional plasma to form a third silicon nitride film. The third silicon nitride film has a higher wet etch rate than the second silicon nitride film after treatment with the second directional plasma. The processing methods further comprise removing the third silicon nitride film, a portion of the second silicon nitride film, and the first silicon nitride film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "horizontal" as used herein is defined as a plane parallel to the plane or surface of a substrate, regardless of its orientation. In one or more embodiments, the horizontal plane extends from one side of the substrate to the other. As illustrated in the appended figures, the horizontal plane runs from the left of the device (left of page) to the right of the device (right of the page). The term "vertical" refers to a direction perpendicular to the horizontal plane as just defined. The vertical plane extends from close to the substrate to a point or plane distant from the substrate. As illustrated in the appended figures, the vertical plane runs from the top of the device (top of the page) to the substrate (bottom of the page) such that the vertical plane is parallel to the sidewall of the feature. Terms, such as "above", "below", "bottom", "top", "side" (as in "sidewall"), "higher", "lower", "upper", "over", and "under", are defined with respect to the horizontal plane, as shown in the figures. The skilled artisan will recognize that the directional descriptions are relative to the orientation of the device and are not limited to any particular substrate orientation.

The term "on" indicates that there is direct contact between elements. The term "directly on" indicates that there is direct contact between elements with no intervening elements.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

Methods described herein use an atomic layer deposition (ALD) process. "Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Some embodiments of the disclosure are directed to selective deposition methods that allow for different film properties based on the deposition location on a 3D structure. For example, a film deposited on the top and bottom of a structure can be treated to have different film properties than a film deposited on the sidewall of the structure. Some embodiments of the disclosure advantageously provide methods of forming a film in which wet etching can selectively remove the first film and third film while leaving other portions (e.g., at least a portion of the second film).

Figure 1A:
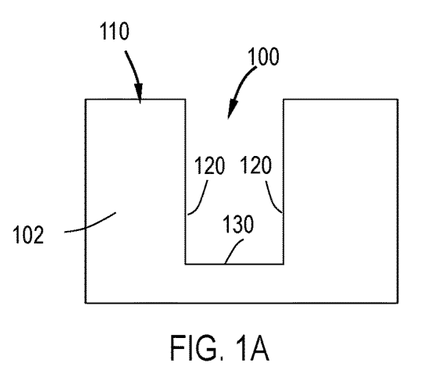
FIG. 1A illustrates a substrate in accordance with one or more embodiments of the disclosure.

Referring to FIGS. 1A-1E, a substrate 102 is shown during stages of selective deposition of films. FIG. 1A illustrates the substrate 102 comprising at least one feature 100 having a top surface 110, a bottom surface 130, and a sidewall 120. The Figures show substrates 102 having a single feature 100 for illustrative purposes; however, those skilled in the art will understand that there can be more than one feature. The shape of the feature 102 can be any suitable shape including but not limited to trenches, cylindrical vias that, for example, transfer current between films when filled with metal, and electrodes that transfer energy within the same films. As used herein, the term "feature" means any intentional surface irregularity. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1, or 40:1.

Figure 1B:
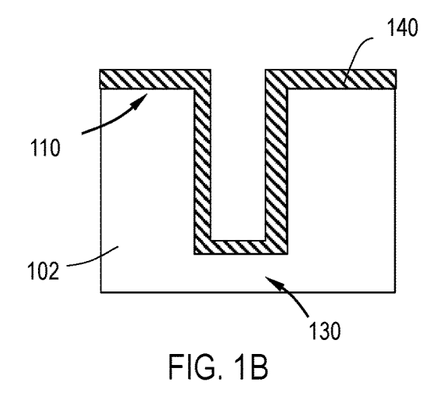
FIG. 1B illustrates a substrate in accordance with one or more embodiments of the disclosure.

FIG. 1B illustrates a first film 140 having a horizontal surface and a vertical surface conformally deposited on the substrate 102. As used herein, the term "conformal", or "conformally", refers to a film that adheres to and uniformly covers exposed surfaces with a thickness having a variation of less than 1% relative to the average thickness of the film. For example, a 1,000 Å thick film would have less than a 10 Å variation in thickness. This thickness and variation includes at least edges, corners, sides, and the bottom of recesses. For example, a conformal film deposited by ALD in various embodiments of the disclosure would provide coverage over the deposited region of essentially uniform thickness on complex surfaces. In one or more embodiments, the conformally deposited first film 140 has a thickness in a range of from 20 Å to 100 Å. In one or more embodiments, the conformally deposited first film 140 has a thickness in a range of from 30 Å to 80 Å.

Some embodiments of the disclosure are directed to wet etch rates of films, among other film properties. Without intending to be bound by theory, wet etch rates of films may be determined based on the particular chemical process and amount of time that the films are in etch solution. In one or more embodiments, the first film 140 is exposed to air, such that a thin layer of native oxide is formed on the first film 140. In one or more embodiments, the first film 140 in dilute HF 100:1 etch solution has a high wet etch rate. In one or more embodiments, the wet etch rate of the first film 140 on the top surface 110 and the bottom surface 130 is at least 2 times greater than the wet etch rate of the first film 140 on the sidewall 120. In one or more embodiments, the wet etch rate of the first film 140 on the top surface 110 and the bottom surface 130 in dilute HF 100:1 etch solution is in a range of from 5 Å/min to 50 Å/min.

Figure 1C:
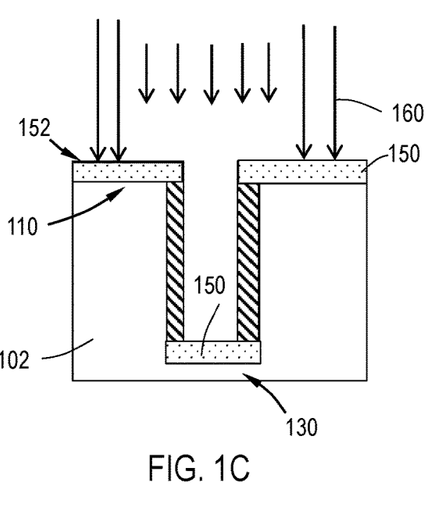
FIG. 1C illustrates a substrate in accordance with one or more embodiments of the disclosure.

FIG. 1C illustrates treatment of the first film 140 formed in FIG. 1B to form a second film 150. In one or more embodiments, the horizontal surface (or top surface) 152 of the first film 140 is treated with a first plasma 160 having a high ion concentration to form the second film 150 on the top surface 110 and the bottom surface 130 of the feature 100. In one or more embodiments, plasma with a high ion concentration has an ion concentration greater than or equal to about $10^{10}/cm^3$. In one or more embodiments, the plasma with the high ion concentration has an ion concentration greater than or equal to about $10^9/cm^3$, $10^{11}/cm^3$, $10^{12}/cm^3$, $10^{13}/cm^3$ or $10^{14}/cm^3$. The plasma used in the treatment can be any suitable plasma (e.g., direct or remote) which is capable of modifying the film properties.

In one or more embodiments, the first plasma 160 is a directional plasma. As used in this specification and the appended claims, the term "directional plasma" means that the energetic species present in the plasma (ions and radicals) move in a specified direction. For example, in FIG. 1C, the first plasma 160 is illustrated moving downward so that the energetic species are able to contact the first film 140 on the top surface 110 and the bottom surface 130 but have minimal contact with the film 140 on the sidewall 120. Stated differently, the first plasma 160 does not substantially affect the film 140 on the sidewall 120.

A directional plasma can be formed in a number of other ways. In one or more embodiments, the horizontal surface of the first film 140 is exposed to at least one RF frequency. In one or more embodiments, the horizontal surface of the first film 140 is exposed to a first RF frequency in a range of from 13.56 MHz to 60 MHz to generate a directional plasma and a second RF frequency in a range of from 350 kHz to 13.56 MHz to adjust an energy and a directionality of the first plasma 160. A directional plasma can be formed as a remote plasma in which the plasma species are excited remotely from the substrate surface and flow toward the substrate surface. The substrate may not be part of the electrical path used to generate the plasma. A directional plasma may also be formed as a direct plasma in which the substrate or substrate support serve as an electrode in the plasma formation. A remote plasma is generally a diffuse plasma and can be made directional by applying a bias to the substrate so that the ions are attracted to and move toward the substrate. In one or more embodiments, the directional plasma comprises one or more of hydrogen, argon, nitrogen, ammonia, oxygen, and helium. In one or more embodiments, the directional plasma is capacitively coupled plasma.

The amount of time used for treatment may affect the amount of damage caused to the film on the top and bottom of the feature. The plasma species and power may affect the depth of the damage caused to the film. A treatment process that causes deeper damage to the film can be repeated less often than a treatment process that causes shallower damage to the film. For example, a $He/NH_3$ plasma may cause deeper damage than an $Ar/NH_3$ plasma so that the film deposited can be thicker before treating with the $He/NH_3$ plasma.

In some embodiments, the first film 140 is exposed to the first plasma 160 for a time period in a range of 0.5 seconds to 5 seconds as part of the conformal deposition step of an ALD cycle. In other embodiments, the first film 140 is exposed to the first plasma 160 for a time period in a range of 1 second to 10 seconds after a predetermined number of ALD cycles. In other embodiments, the first film 140 is exposed to the first plasma 160 for a time period in a range of 1 second to 10 seconds after a predetermined thickness of the first film 140 is deposited. In further embodiments, the first film 140 is exposed to the first plasma 160 as part of a post-treatment process. In further embodiments, the post-treatment process comprises exposing the first film 140 to the first plasma 160 for a time period in a range of 2 seconds to 60 seconds.

In one or more embodiments, the second film 150 is formed on the horizontal surface on the top surface 110 and the horizontal surface on the bottom surface 130. In one or more embodiments, the second film 150 has a lower wet etch rate than the first film 140. In one or more embodiments, the wet etch rate of the second film 150 in dilute HF 100:1 etch solution is in a range of from 2 Å/min to 5 Å/min. In one or more embodiments, the wet etch rate of the second film 150 in dilute HF 100:1 etch solution is in a range of from 2 Å/min to 3 Å/min.

Figure 1D:
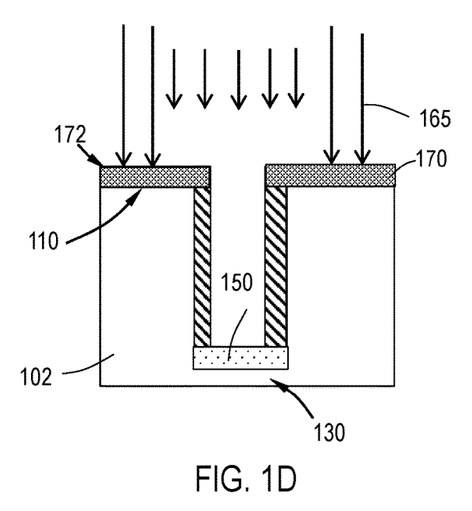
FIG. 1D illustrates a substrate in accordance with one or more embodiments of the disclosure.

FIG. 1D illustrates treatment of the second film 150 formed in FIG. 1C to form a third film 170. In one or more embodiments, the horizontal surface 172 of the second film 150 is treated with a second plasma 165 to form the third film 170 on the top surface 110. In FIG. 1D, the second film 150 is on the bottom surface 130. In one or more embodiments, the first plasma 160 and the second plasma 165 are the same. In FIG. 1D, the second plasma 165 is illustrated moving downward so that the energetic species are able to contact the second film 150 on the top surface 110 and the bottom surface 130 but have minimal contact with the first film 140 on the sidewall 120. Stated differently, the second plasma 165 does not substantially affect the film 140 on the sidewall 120.

In one or more embodiments, the third film 170 has a higher wet etch rate than the second film 150. In some embodiments, the wet etch rate of the third film 170 on the top surface 110 increases at a faster rate than the wet etch rate of the second film 150 on the bottom surface 130 during treatment of the second film 150. In one or more embodiments, the third film 170 in dilute HF 100:1 etch solution has a wet etch rate greater than or equal to a range of from 10 Å/min to 15 Å/min.

Figure 1E:
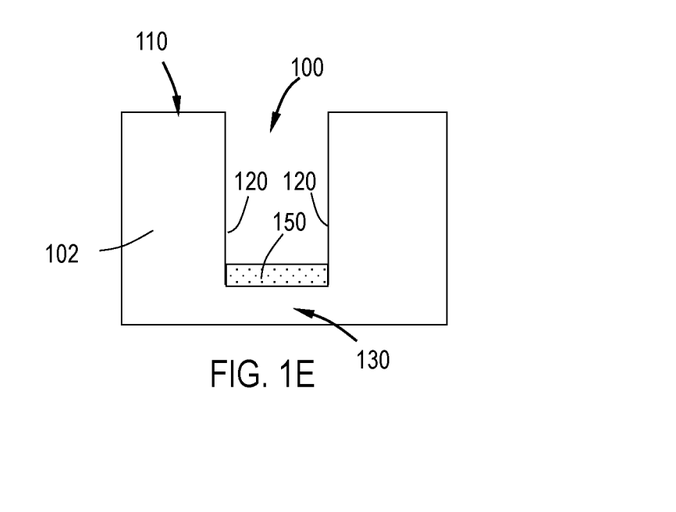
FIG. 1E illustrates a substrate in accordance with one or more embodiments of the disclosure.

FIG. 1E illustrates selective removal of the first film 140 from the vertical surface and sidewall 120 of the feature 100, a portion of the second film 150, and the third film 170. In one or more embodiments, the first film 140 and the third film 170 are selectively removed by etching with dilute hydrofluoric acid (HF). In one or more embodiments, the second film 150 has a thickness in a range of 20 Å to 60 Å after selective removal of a portion of the second film 150. The thickness of the second film 150 after selective removal is less than the thickness of the second film 150 that was formed in FIG. 1C.

Referring again to FIG. 1E, the remaining portion of the second film 150 may be used in front end of the line (FEOL) dielectric applications, such as gate spacers. In one or more embodiments, the remaining portion of the second film 150 is used as a barrier layer.

FIGS. 1B-1E show selectively deposited ALD films. In one or more embodiments, the first film 140, the second film 150, and the third film 170 independently comprise one or more of metal nitride, silicon nitride (SiN), silicon oxynitride (SiON), and silicon oxycarbonitride (SiOCN).

The formation of each of the first film 140, the second film 150, and the third film 170 can be performed by any suitable method including, but not limited to, atomic layer deposition (ALD), plasma-enhanced atomic layer deposition (PEALD), chemical vapor deposition (CVD), and plasma-enhanced chemical vapor deposition (PECVD). In some embodiments, each of the first film 140, the second film 150, and the third film 170 is formed by an ALD process in which the substrate 102 is sequentially exposed to a metal-containing precursor and a nitrogen reactant. In one or more embodiments, the first film 140, the second film 150, and the third film 170 each comprise silicon nitride (SiN). In some embodiments, a silicon-containing precursor and a nitrogen reactant are used to form a film comprising silicon nitride (SiN). As used in this regard, a "silicon precursor" reacts with the surface of the substrate so that silicon molecules remain on the substrate 102. As used in this regard, a "nitrogen reactant" reacts with the silicon molecules on the substrate 102.

While the following embodiments of the disclosure are described with respect to the deposition of silicon nitride (SiN) films, those skilled in the art will understand that the disclosure is not so limited. Other films (e.g., films comprising metal nitride, silicon oxynitride (SiON), and silicon oxycarbonitride (SiOCN)) can be deposited, treated, and etched.

In some embodiments, the silicon nitride (SiN) film is formed on the substrate 102 with exposure to a nitrogen precursor between the exposure to the silicon precursor and the nitrogen reactant. As used in this regard, a "nitrogen precursor" reacts with the substrate surface and minimally reacts with the silicon species already on the substrate 102. Stated differently, the nitrogen precursor comprises a species that does not react with silicon precursor molecules on the substrate 102. The exposure to the nitrogen precursor can occur before, during or after exposure to the silicon precursor as both the nitrogen precursor species and the silicon precursor species are reactive with the substrate 102 and are minimally reactive with each other.

Suitable silicon precursors include, but are not limited to, silane, disilane, dichlorisilane (DCS), bis(diethylamino)silane (BDEAS), tetrakis(dimethylamino)silane (TDMAS), and/or bis(tertiary-butylamino)silane (BTBAS). In some embodiments, the silicon precursor comprises dichlorosilane. In one or more embodiments, the silicon precursor consists essentially of dichlorosilane, meaning that there is less than 1% on an atomic basis of silicon species other than dichlorosilane.

Suitable nitrogen precursors include but are not limited to molecular nitrogen and ammonia. The process conditions employed during nitrogen precursor exposure can affect the reactivity of the nitrogen species with the silicon species on the surface. In some embodiments, the process conditions are configured such that the nitrogen precursor reacts substantially only with the substrate surface. As used in this regard, the term "substantially only" means that the nitrogen precursor reacts with less than about 10% of the surface silicon species.

The nitrogen reactant is a species that forms the metal nitride film on the substrate 102. In some embodiments, the nitrogen reactant provides the nitrogen atoms for the formation of the metal nitride film (e.g., SiN). In one or more embodiments, the nitrogen reactant does not include a nitrogen-containing species and forms the nitride film by facilitating a reaction between surface species. Suitable nitrogen reactants include but are not limited to nitrogen plasma, ammonia plasma, a plasma comprising a mixture of two or more of hydrogen, nitrogen, ammonia, helium, argon, or oxygen. In some embodiments, the nitrogen reactant comprises a plasma of argon and ammonia, a plasma of argon and nitrogen, a plasma of argon and oxygen, or a plasma of helium and ammonia. In some embodiments, the nitrogen reactant comprises a plasma without nitrogen that reacts with the nitrogen species on the surface. In some embodiments, the nitrogen reactant comprises a plasma of hydrogen and argon, or a plasma of hydrogen and nitrogen, or a plasma of hydrogen and helium, or a plasma of hydrogen and ammonia, or a plasma of hydrogen and oxygen.

In some embodiments, forming the silicon nitride (SiN) film comprises forming the film comprises sequentially exposing the substrate surface to a silicon precursor comprising dichlorosilane, a nitrogen precursor comprising ammonia, and a nitrogen reactant comprising a $N_2$/Ar plasma or a $H_2$/Ar plasma.

Figure 2:
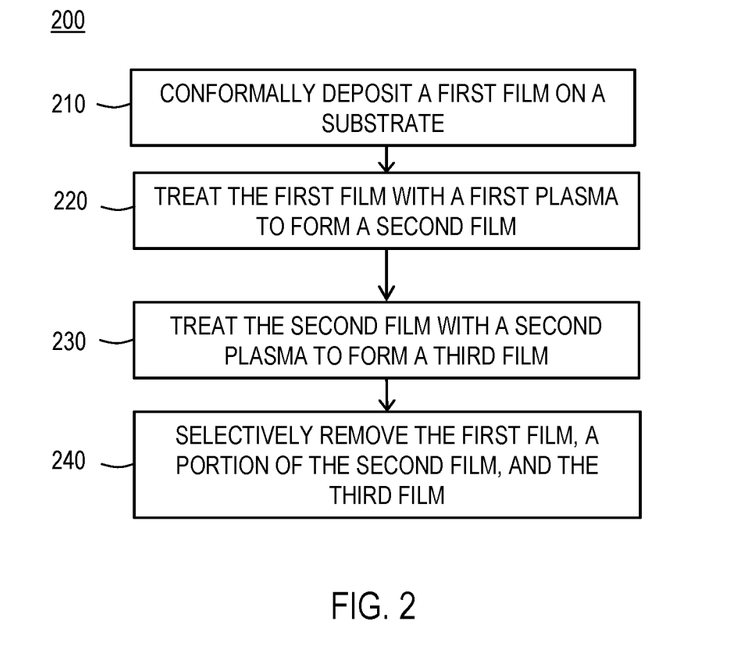
FIG. 2 illustrates a process flow diagram of a method of forming a film in accordance with one or more embodiments of the disclosure.

FIG. 2 illustrates a process flow diagram of a method of forming a film. FIG. 2 illustrates a method of forming any of the films of one or more embodiments shown in FIGS. 1A-1E. In some embodiments, the methods include two processes: film deposition and plasma treatment. The methods described herein may be repeated to form a film of a desired thickness. Each step in the film formation process can be sequentially repeated to form a film for treatment. The conformally deposited film can then be treated and the process repeated.

Some embodiments of the disclosure are advantageously performed in a single processing chamber. In some embodiments, the selective deposition includes two processes in a single processing chamber: film deposition and plasma treatment. These two processes make up a single ALD cycle. The metal precursor and nitrogen reactant form a conformally deposited metal nitride film and the plasma treatment modifies the film on the top and bottom of the feature. The plasma treatment process could form either N—H or metal-oxide bonds on the film surface and penetrate into the film a depth based on the treatment time and plasma power. This has been found to produce higher wet etch rates on the top surface 110 and bottom surface 130 of the feature 100. The deposition film thickness and plasma treatment level can be adjusted to increase the wet etch rate selectivity. Selective deposition in some embodiments is performed at substrate temperatures in the range of about 200° C. to about 550° C.

Referring to FIG. 2, the method 200 comprises, at operation 210, conformally depositing a first film on a substrate. The substrate comprises at least one feature having a top surface, a bottom surface, and a sidewall. The first film has a horizontal surface and a vertical surface. In one or more embodiments, conformally depositing the first film comprises exposing the substrate to a metal-containing precursor and a nitrogen reactant. In one or more embodiments, conformally depositing the first film comprises exposing the substrate to a silicon-containing precursor and a nitrogen reactant.

At operation 220, the method 200 comprises treating the horizontal surface of the first film with a first plasma to form a second film on the horizontal surface. In one or more embodiments, the treating the horizontal surface of the first film includes exposing the film to at least one RF frequency. In one or more embodiments, treating the first film comprises exposing the film to a first RF frequency in a range of from 13.56 MHz to 60 MHz to generate a directional plasma and a second RF frequency in a range of from 350 kHz to 13.56 MHz to adjust an energy and a directionality of the directional plasma.

In some embodiments, the first film is exposed to the first plasma for a time period in a range of 0.5 seconds to 5 seconds as part of the conformal deposition step of a single ALD cycle. In other embodiments, the first film is exposed to the first plasma for a time period in a range of 1 second to 10 seconds after performing a predetermined number of ALD cycles. In other embodiments, the first film is exposed to the first plasma for a time period in a range of 1 second to 10 seconds after a predetermined thickness of the first film is deposited. In further embodiments, the first film is exposed to the first plasma as part of a post-treatment process. In further embodiments, the post-treatment process comprises exposing the first film 140 to the first plasma 160 for a time period in a range of 2 seconds to 60 seconds.

At operation 230, the method 200 comprises treating the second film on the horizontal surface with a second plasma to form a third film on the horizontal surface. In one or more embodiments, the third film has a higher wet etch rate than the second film. At operation 240, the method 200 comprises selectively removing the first film, a portion of the second film, and the third film. In one or more embodiments, removing the third film and the first film comprises etching with dilute hydrofluoric acid (HF). In one or more embodiments, the second film has a thickness in a range of 20 Å to 60 Å after selective removal.

Embodiments of the disclosure provide processing methods of forming silicon nitride films. The processing methods may be used to form any of the films of one or more embodiments shown in FIGS. 1A-1E. The processing methods may be performed under the same or similar process conditions as the methods described above with reference FIG. 2, unless otherwise indicated. In one or more embodiments, the processing methods comprise exposing a substrate to a deposition environment comprising at least one deposition cycle. In one or more embodiments, the deposition cycle comprises sequential exposure of the substrate to a silicon precursor and a nitrogen containing reactant to form a first silicon nitride film on the substrate. The substrate has at least one feature including a top surface, a bottom surface, and a sidewall. The processing methods comprise treating the first silicon nitride film with a first directional plasma to form a second silicon nitride film and treating the second silicon nitride film with a second directional plasma to form a third silicon nitride film. The processing methods further comprise removing the third silicon nitride film, a portion of the second silicon nitride film, and the first silicon nitride film. Embodiments of the disclosure provide repeating the deposition cycle to form a first silicon nitride film having a thickness in a range of from 20 Å to 100 Å.

Figure 3:
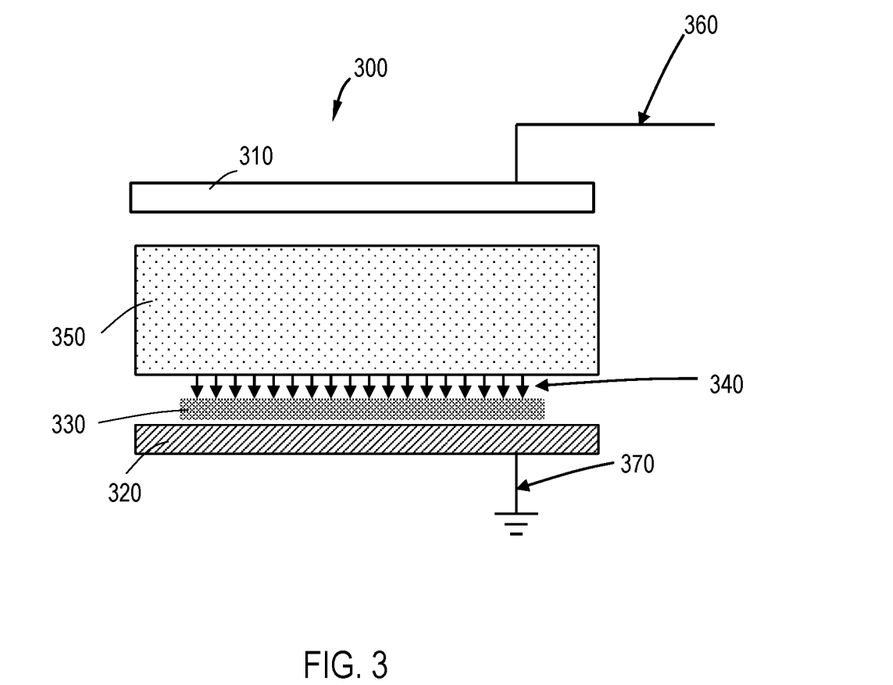
FIG. 3 shows a schematic view of a capacitively coupled plasma (CCP) chamber in accordance with one or more embodiments of the disclosure.

FIG. 3 shows a schematic view of a capacitively coupled plasma (CCP) chamber 300. The CCP chamber 300 may be used as a component of a processing chamber. The CCP chamber 300 may function to generate a plasma inside the processing chamber. In one or more embodiments, the CCP chamber 300 comprises a top electrode 310 and a bottom electrode 320. In one or more embodiments, an RF plasma 350 can be generated by and fed through one or more of a first RF power source 360 and a second RF power source 370. In one or more embodiments, the top electrode 310 is a showerhead. In one or more embodiments, the bottom electrode 320 is a pedestal. In one or more embodiments, a wafer 330 is provided on the bottom electrode 320. As used in this specification and the appended claims, the term "provided" used in this manner means that the wafer 330 is placed or positioned in an environment for processing. In one or more embodiments, one or more of the films of embodiments shown in FIGS. 1A-1E are deposited on the wafer 330.

In one or more embodiments, the RF plasma 350 forms between the first electrode 310 and the bottom electrode 320. In one or more embodiments, a sheath 340 represents a direction of an electric field flow. In the embodiment illustrated in FIG. 3, the sheath 340 shows the electric field flowing downward toward the bottom electrode 320. In one or more embodiments, the electric field flows upward toward the top electrode 310 (not illustrated).

According to one or more embodiments, the substrate is subjected to processing prior to and/or after forming the film. This processing can be performed in a single processing chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chamber, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or a curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a film, the method comprising:
   conformally depositing a first film on a substrate, the substrate comprising at least one feature having a top surface, a bottom surface, and a sidewall, and the first film having a horizontal surface and a vertical surface;
   treating the horizontal surface of the first film with a first plasma to form a second film on the horizontal surface, the second film having a lower wet etch rate than the first film;
   treating the second film on the horizontal surface with a second plasma to form a third film on the horizontal surface, the third film having a higher wet etch rate than the second film; and
   selectively removing the first film, a portion of the second film, and the third film.

2. The method of claim 1, further comprising repeating the method.

3. The method of claim 1, wherein the first film, the second film, and the third film independently comprise one or more of metal nitride, silicon nitride (SiN), silicon oxynitride (SiON), and silicon oxycarbonitride (SiOCN).

4. The method of claim 1, wherein conformally depositing the first film comprises exposing the substrate to a silicon-containing precursor and a nitrogen reactant.

5. The method of claim 1, wherein conformally depositing the first film comprises exposing the substrate to a metal-containing precursor and a nitrogen reactant.

6. The method of claim 1, wherein the wet etch rate of the third film is greater than or equal to a range of from 10 Å/min to 15 Å/min as compared to the wet etch rate of the second film being in a range of from 2 Å/min to 5 Å/min.

7. The method of claim 1, wherein the first film has a thickness in a range of from 20 Å to 100 Å.

8. The method of claim 1, wherein treating the first film comprises exposing the film to a first RF frequency in a range of from 13.56 MHz to 60 MHz to generate a directional plasma and a second RF frequency in a range of from 350 kHz to 13.56 MHz to adjust an energy and a directionality of the directional plasma.

9. The method of claim 8, wherein the directional plasma comprises one or more of hydrogen, argon, nitrogen, ammonia, oxygen, and helium.

10. The method of claim 8, wherein the directional plasma is capacitively coupled plasma.

11. The method of claim 8, wherein the first film is exposed to the directional plasma for a time period in a range of 0.5 seconds to 60 seconds.

12. The method of claim 1, wherein the first plasma and the second plasma are the same.

13. The method of claim 1, wherein the wet etch rate of the third film on the top surface increases at a faster rate than the wet etch rate of the second film on the bottom surface during treatment of the second film.

14. The method of claim 1, wherein removing the third film and the first film comprises etching with dilute hydrofluoric acid (HF).

15. A processing method comprising:
exposing a substrate to a deposition environment comprising at least one deposition cycle, the deposition cycle comprising sequential exposure of the substrate to a silicon precursor and a nitrogen containing reactant to form a first silicon nitride film on the substrate, the substrate having at least one feature including a top surface, a bottom surface, and a sidewall;
treating the first silicon nitride film with a first directional plasma to form a second silicon nitride film, the second silicon nitride film having a lower wet etch rate than the first silicon nitride film;
treating the second silicon nitride film with a second directional plasma to form a third silicon nitride film, the third silicon nitride film having a higher wet etch rate than the second silicon nitride film; and
removing the third silicon nitride film, a portion of the second silicon nitride film, and the first silicon nitride film.

16. The method of claim 15, further comprising repeating the deposition cycle to form a first silicon nitride film having a thickness in a range of from 20 Å to 100 Å.

17. The method of claim 15, wherein the first directional plasma and the second directional plasma independently comprise one or more of hydrogen, argon, nitrogen, ammonia, oxygen, and helium.

18. The method of claim 17, wherein the first directional plasma and the second directional plasma are a capacitively coupled plasma.

19. The method of claim 15, wherein the first silicon nitride film is exposed to the first directional plasma for a time period in a range of 0.5 seconds to 60 seconds.

20. The method of claim 15, wherein removing comprises etching with dilute hydrofluoric acid (HF).

* * * * *